United States Patent
Kawai et al.

(10) Patent No.: US 8,389,386 B2
(45) Date of Patent: Mar. 5, 2013

(54) STACKED WAFER MANUFACTURING METHOD

(75) Inventors: Akihito Kawai, Ota-Ku (JP); Koichi Kondo, Ota-ku (JP)

(73) Assignee: Disco Corporation, Tokyo (JP)

(*) Notice: Subject to any disclaimer, the term of this patent is extended or adjusted under 35 U.S.C. 154(b) by 74 days.

(21) Appl. No.: 13/088,591

(22) Filed: Apr. 18, 2011

(65) Prior Publication Data

US 2011/0256667 A1 Oct. 20, 2011

(30) Foreign Application Priority Data

Apr. 20, 2010 (JP) .................................. 2010-096840

(51) Int. Cl.
*H01L 21/00* (2006.01)

(52) U.S. Cl. .................. 438/464; 438/113; 257/E21.599

(58) Field of Classification Search .................. 438/464, 438/460, 459, 110, 113
See application file for complete search history.

(56) References Cited

U.S. PATENT DOCUMENTS

| 6,762,074 | B1 * | 7/2004 | Draney et al. ................. 438/106 |
| 7,439,162 | B2 * | 10/2008 | Norimoto et al. ............. 438/464 |
| 7,863,092 | B1 * | 1/2011 | Chaware et al. .............. 438/106 |
| 2008/0048343 | A1 * | 2/2008 | Grigg et al. ................... 257/778 |

FOREIGN PATENT DOCUMENTS

| JP | 2003-249620 | 9/2003 |
| JP | 2004-207606 | 7/2004 |

* cited by examiner

*Primary Examiner* — Charles Garber
*Assistant Examiner* — Reema Patel
(74) *Attorney, Agent, or Firm* — Greer, Burns & Crain, Ltd.

(57) ABSTRACT

A manufacturing method for a stacked wafer configured by bonding a mother wafer having a plurality of first semiconductor device and a stacking wafer having a plurality of second semiconductor devices. The manufacturing method includes the steps of attaching a protective member to the front side of the stacking wafer to protect the second semiconductor devices, next grinding the back side of the stacking wafer, next bonding the front side of a reinforcing wafer through a bonding layer to the back side of the stacking wafer, next dividing the stacking wafer together with the reinforcing wafer into the plural second semiconductor devices, next bonding the front side of each second semiconductor device to the front side of the mother wafer to thereby connect the electrodes of each second semiconductor device to the electrodes of the corresponding first semiconductor device of the mother wafer, and finally grinding the reinforcing wafer bonded to the back side of each second semiconductor device to thereby remove the reinforcing wafer.

3 Claims, 17 Drawing Sheets

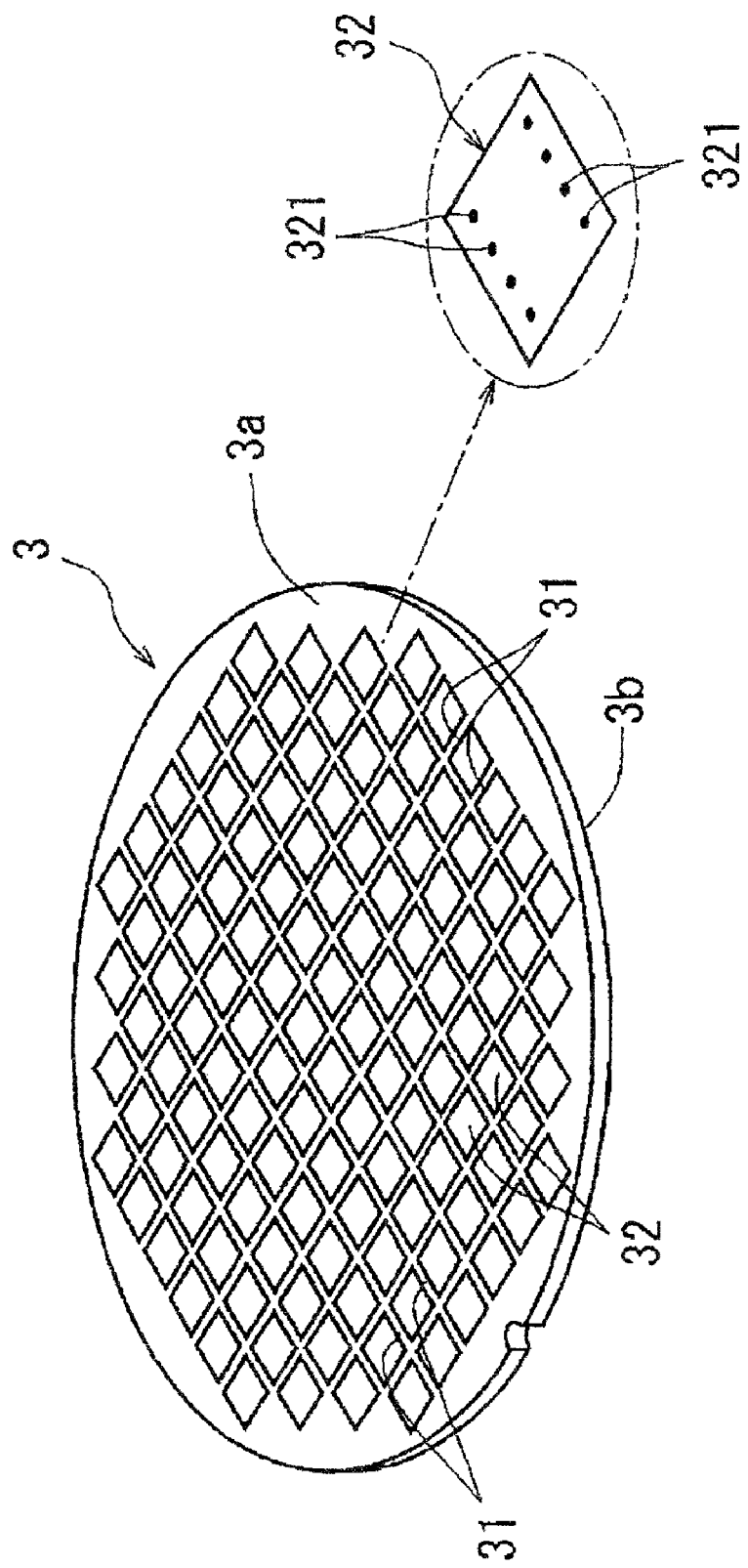

FIG.3A
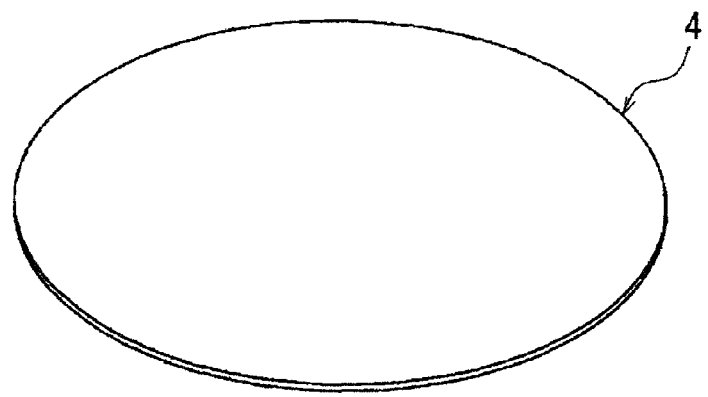
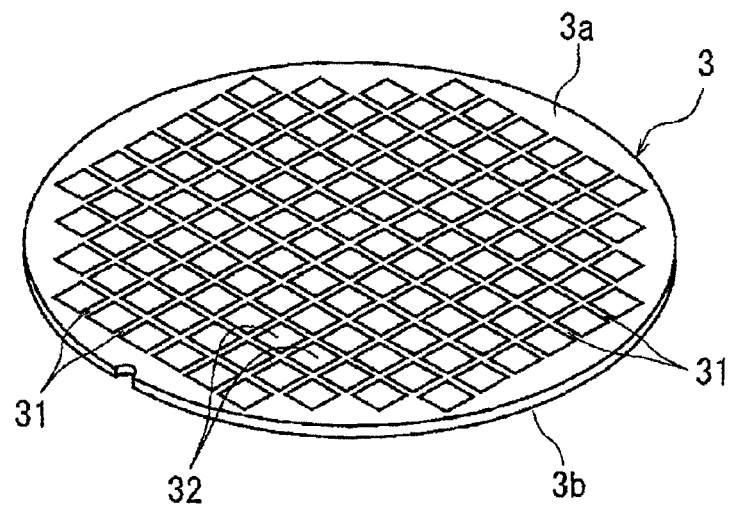
FIG.3B
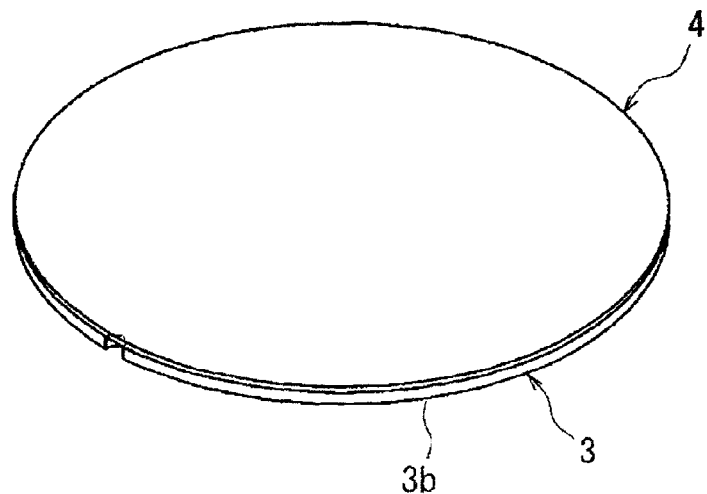

STACKED WAFER MANUFACTURING METHOD

BACKGROUND OF THE INVENTION

1. Field of the Invention

The present invention relates to a manufacturing method for a stacked wafer configured by bonding a mother wafer having a plurality of first semiconductor devices and a stacking wafer having a plurality of second semiconductor devices in such a manner that electrodes provided on the front side of each second semiconductor device are respectively bonded to electrodes provided on the front side of each first semiconductor device.

2. Description of the Related Art

In a semiconductor device fabrication process, a plurality of crossing division lines called streets are formed on the front side of a substantially disk-shaped semiconductor wafer to partition a plurality of regions where a plurality of semiconductor devices such as ICs and LSIs are respectively formed. The semiconductor wafer is cut along the streets to thereby divide the regions where the semiconductor devices are formed from each other, thus manufacturing the individual semiconductor devices.

For the purposes of size reduction and higher functionality of equipment, a module structure having the following configuration is in practical use. This module structure is such that a plurality of second semiconductor devices (stacking devices) are stacked on the front side of a mother wafer having a plurality of first semiconductor devices and that electrodes of each second semiconductor device are respectively connected to electrodes of each first semiconductor device formed on the front side of the mother wafer (see Japanese Patent Laid-open No. 2003-249620, for example). This packaging technique eliminates the need for wires for connecting the electrodes provided on the front side of each first semiconductor device to the electrodes provided on the front side of each second semiconductor device. That is, a wire bonding step can be omitted to thereby improve the productivity.

For the purposes of size reduction and higher functionality of equipment produced by using such a stacked wafer, the back side of a stacking wafer having the plural second semiconductor devices is ground to reduce the thickness of the stacking wafer to tens of micrometers before it is stacked on the front side of the mother wafer. However, when the stacking wafer is ground to tens of micrometers in thickness, the stacking wafer loses its rigidity like a sheet of paper, so that it bends. Accordingly, it is difficult to stack the stacking wafer on the mother wafer so that the second semiconductor devices respectively correspond to the first semiconductor devices in proper positions, thus causing faulty electrical continuity between the electrodes of each second semiconductor device and the electrodes of the corresponding first semiconductor device.

To prevent the bending of a wafer due to grinding, there has been proposed a method of grinding the back side of the wafer in the condition where a substrate formed from a hard plate is bonded through a wax or the like to the front side of the wafer (see Japanese Patent Laid-open No. 2004-207606, for example).

SUMMARY OF THE INVENTION

In processing the stacking wafer having the plural second semiconductor devices, the back side of the stacking wafer is ground in the condition where the substrate is bonded through a wax or the like to the front side of the stacking wafer, and bumps are next mounted on the plural electrodes embedded in each second semiconductor device and exposed to the back side thereof. Alternatively, via holes for embedding the electrodes are formed in each second semiconductor device by laser processing and the electrodes are next embedded in these via holes. In mounting the bumps or forming the via holes by laser processing, the stacking wafer is heated. Accordingly, a bonding layer for bonding the substrate to the front side of the stacking wafer must have resistance to a temperature of about 250° C. Accordingly, in removing the substrate from the stacking wafer after grinding the back side of the stacking wafer in the condition where the substrate is bonded through the bonding layer to the front side of the stacking wafer, it is necessary to perform an operation such that the substrate is heated to a temperature higher than 250° C., that the substrate is slid along the front side of the stacking wafer and removed therefrom without applying a load to the stacking wafer, and that the substrate is cooled to ordinary temperature. Therefore, the productivity is low.

It is therefore an object of the present invention to provide a stacked wafer manufacturing method which can reliably bond the plural electrodes provided on the front side of each second semiconductor device to the plural electrodes of each first semiconductor device formed on the front side of the mother wafer.

In accordance with a first aspect of the present invention, there is provided a manufacturing method for a stacked wafer configured by bonding a mother wafer having a plurality of first semiconductor devices on the front side thereof and a stacking wafer having a plurality of second semiconductor devices on the front side thereof, each of the first semiconductor devices having a plurality of first electrodes, each of the second semiconductor devices having a plurality of second electrodes, the manufacturing method including a protective member attaching step of attaching a protective member to the front side of the stacking wafer; a stacking wafer grinding step of holding a unit of the stacking wafer and the protective member attached thereto on a chuck table of a grinding apparatus after performing the protective member attaching step and grinding the back side of the stacking wafer to reduce the thickness of the stacking wafer to a predetermined thickness; a reinforcing wafer bonding step of bonding the front side of a reinforcing wafer through a bonding layer to the back side of the stacking wafer after performing the stacking wafer grinding step; a stacking wafer dividing step of dividing the stacking wafer together with the reinforcing wafer into the plurality of second semiconductor devices after performing the reinforcing wafer bonding step; a second semiconductor device bonding step of respectively bonding the plurality of second electrodes provided on the front side of each second semiconductor device to the plurality of first electrodes provided on the mother wafer after performing the stacking wafer dividing step; and a reinforcing wafer removing step of holding a unit of the mother wafer, the second semiconductor devices, and the reinforcing wafer bonded together on a chuck table of a grinding apparatus after performing the second semiconductor device bonding step and grinding the reinforcing wafer bonded to the back side of each second semiconductor device to thereby remove the reinforcing wafer from the back side of each second semiconductor device.

In accordance with a second aspect of the present invention, there is provided a manufacturing method for a stacked wafer configured by bonding a mother wafer having a plurality of first semiconductor devices on the front side thereof and a stacking wafer having a plurality of second semiconductor devices on the front side thereof, each of the first semiconductor devices having a plurality of first electrodes, each of the second semiconductor devices having a plurality of second electrodes, the manufacturing method including a protective member attaching step of attaching a protective member to the front side of the stacking wafer; a stacking wafer grinding step of holding a unit of the stacking wafer and the protective member attached thereto on a chuck table of a grinding apparatus after performing the protective member attaching step and grinding the back side of the stacking wafer to reduce the thickness of the stacking wafer to a predetermined thickness; a reinforcing wafer bonding step of bonding the front side of a reinforcing wafer through a bonding layer to the back side of the stacking wafer after performing the stacking wafer grinding step; a second semiconductor device bonding step of stacking a unit of the stacking wafer and the reinforcing wafer bonded together on the mother wafer in the condition where the front side of the stacking wafer is opposed to the front side of the mother wafer after performing the reinforcing wafer bonding step, thereby respectively bonding the second electrodes provided on the front side of each second semiconductor device of the stacking wafer to the first electrodes provided on the front side of each first semiconductor device of the mother wafer; and a reinforcing wafer removing step of holding a unit of the mother wafer, the stacking wafer, and the reinforcing wafer bonded together on a chuck table of a grinding apparatus after performing the second semiconductor device bonding step and grinding the reinforcing wafer bonded to the back side of the stacking wafer to thereby remove the reinforcing wafer from the back side of the stacking wafer.

In the stacked wafer manufacturing method according to the first aspect of the present invention, the back side of the stacking wafer is ground to reduce the thickness of the stacking wafer to a predetermined thickness. Thereafter, the front side of the reinforcing wafer is bonded through the bonding layer to the back side of the stacking wafer. Thereafter, the stacking wafer is divided together with the reinforcing wafer to obtain the individual second semiconductor devices. Thereafter, the plural electrodes provided on the front side of each second semiconductor device bonded to the reinforcing wafer are bonded to the plural electrodes provided on the front side of the mother wafer. Accordingly, each second semiconductor device reduced in thickness can be easily handled, so that the electrodes provided on the front side of each second semiconductor device can be reliably bonded to the electrodes provided on the front side of the mother wafer.

In the reinforcing wafer removing step of removing the reinforcing wafer from the back side of each second semiconductor device, the reinforcing wafer bonded to the back side of each second semiconductor device is removed by grinding, so that no load is applied to each second semiconductor device. Accordingly, it is not necessary to perform an operation such that the reinforcing wafer is heated to a temperature higher than 250° C. for the purpose of removing the reinforcing wafer from the back side of each second semiconductor device, that the reinforcing wafer is slid along the back side of each second semiconductor device and removed therefrom without applying a load to each second semiconductor device, and that the reinforcing wafer is cooled to ordinary temperature. Therefore, the productivity can be improved.

In the stacked wafer manufacturing method according to the second aspect of the present invention, the back side of the stacking wafer is ground to reduce the thickness of the stacking wafer to a predetermined thickness. Thereafter, the front side of the reinforcing wafer is bonded through the bonding layer to the back side of the stacking wafer. Thereafter, the stacking wafer bonded to the reinforcing wafer is stacked on the mother wafer in the condition where the front side of the stacking wafer is opposed to the front side of the mother wafer, thereby bonding the electrodes provided on the front side of each second semiconductor device to the electrodes provided on the front side of each first semiconductor device of the mother wafer. Accordingly, bending of the stacking wafer reduced in thickness can be prevented, so that the electrodes provided on the front side of each second semiconductor device can be reliably bonded to the electrodes provided on the front side of the mother wafer.

In the reinforcing wafer removing step of removing the reinforcing wafer from the back side of each second semiconductor device, the reinforcing wafer bonded to the back side of each second semiconductor device is removed by grinding, so that no load is applied to each second semiconductor device. Accordingly, it is not necessary to perform an operation such that the reinforcing wafer is heated to a temperature higher than 250° C. for the purpose of removing the reinforcing wafer from the back side of each second semiconductor device, that the reinforcing wafer is slid along the back side of each second semiconductor device and removed therefrom without applying a load to each second semiconductor device, and that the reinforcing wafer is cooled to ordinary temperature. Therefore, the productivity can be improved.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 2 is a perspective view of a stacking wafer used in the stacked wafer manufacturing method according to the present invention;

FIGS. 3A and 3B are perspective views for illustrating a protective member attaching step in a first preferred embodiment of the stacked wafer manufacturing method according to the present invention;

DETAILED DESCRIPTION OF THE PREFERRED EMBODIMENTS

Figure 1:
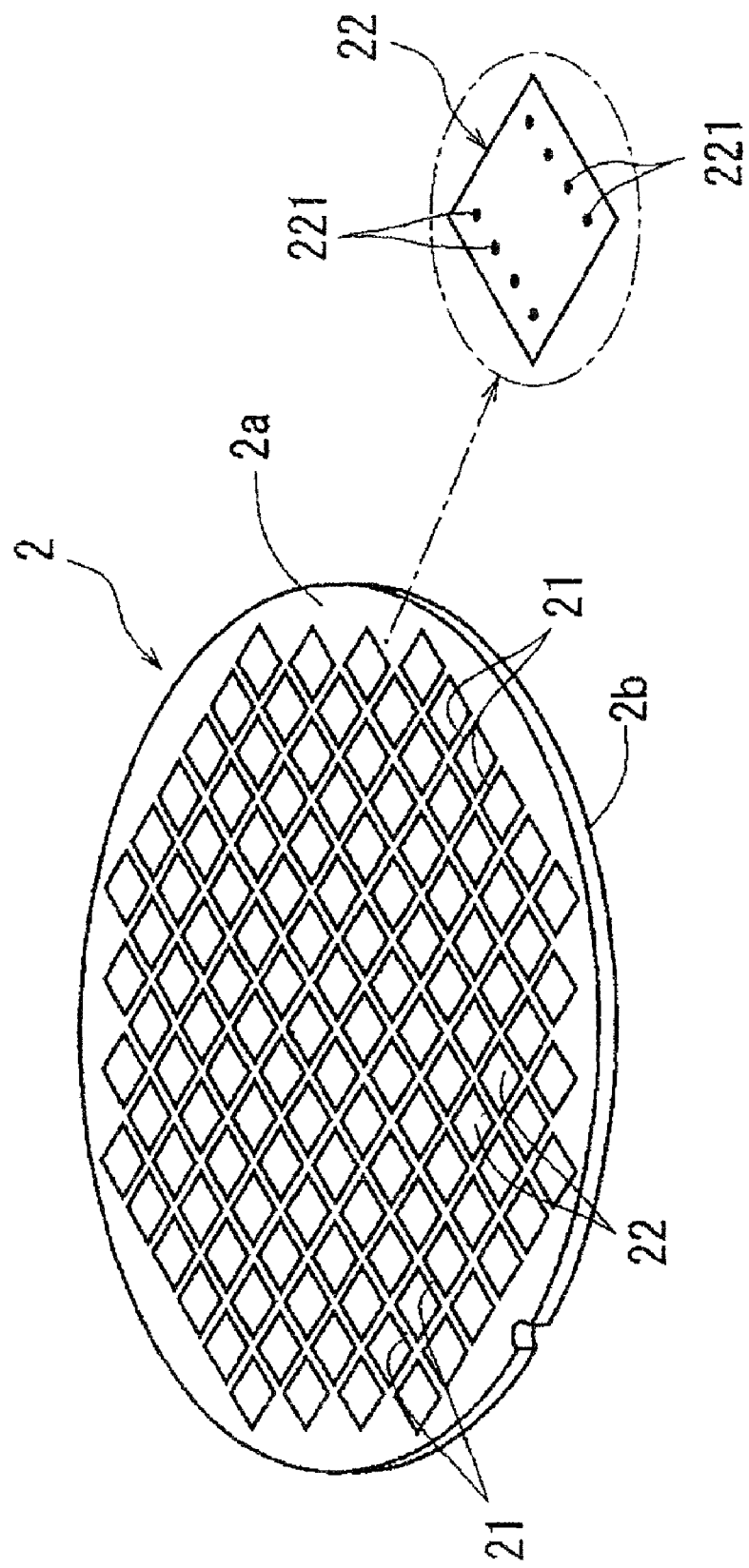
FIG. 1 is a perspective view of a mother wafer used in the stacked wafer manufacturing method according to the present invention.

Some preferred embodiments of the stacked wafer manufacturing method according to the present invention will now be described in detail with reference to the attached drawings. FIG. 1 is a perspective view of a mother wafer 2 as a printed circuit board used in the stacked wafer manufacturing method according to the present invention. The mother wafer 2 shown in FIG. 1 is a disk-shaped silicon wafer having a thickness of 400 µm, for example. The mother wafer 2 has a front side 2a and a back side 2b. A plurality of crossing streets 21 are formed on the front side 2a of the mother wafer 2 to thereby partition a plurality of rectangular regions where a plurality of first semiconductor devices 22 such as ICs and LSIs are respectively formed. Each first semiconductor device 22 is provided with a plurality of electrodes (bumps) 221 projecting from the front side.

FIG. 2 is a perspective view of a stacking wafer 3 used in the stacked wafer manufacturing method according to the present invention. The stacking wafer 3 shown in FIG. 2 is also a disk-shaped silicon wafer having a thickness of 400 µm, for example. The stacking wafer 3 has a front side 3a and a back side 3b. A plurality of crossing streets 31 are formed on the front side 3a of the stacking wafer 3 to thereby partition a plurality of rectangular regions where a plurality of second semiconductor devices (stacking devices) 32 such as ICs and LSIs are respectively formed. A plurality of electrodes 321 are embedded in each second semiconductor device 32 so as to extend from the front side to the back side of each second semiconductor device 32 and project from the front side thereof. The size of each second semiconductor device 32 in the stacking wafer 3 is the same as that of each first semiconductor device 22 in the mother wafer 2, and the plural electrodes 321 of each second semiconductor device 32 respectively correspond to the plural electrodes 221 of each first semiconductor device 22.

There will now be described a first preferred embodiment of the stacked wafer manufacturing method for bonding the front side of each second semiconductor device 32 to the front side 2a of the mother wafer 2 to thereby bond the plural electrodes 221 of the mother wafer 2 and the plural electrodes 321 provided on the front side of each second semiconductor device 32. First, a protective member attaching step is performed in such a manner that a protective member for protecting the plural semiconductor devices 32 is attached to the front side 3a of the stacking wafer 3. More specifically, as shown in FIGS. 3A and 3B, a protective tape 4 as the protective member is attached to the front side 3a of the stacking wafer 3. The protective tape 4 is formed of polyvinyl chloride, for example.

After performing the protective member attaching step mentioned above, a stacking wafer grinding step is performed in such a manner that the unit of the stacking wafer 3 and the protective tape 4 attached thereto is held on a chuck table of a grinding apparatus and the back side 3b of the stacking wafer 3 is ground to reduce the thickness of the stacking wafer 3 to a predetermined thickness. This stacking wafer grinding step is performed by using a grinding apparatus 5 shown in FIG. 4. The grinding apparatus 5 shown in FIG. 4 includes a chuck table 51 for holding a workpiece and grinding means 52 for grinding the workpiece held on the chuck table 51. The chuck table 51 has an upper surface for holding the workpiece under suction. The chuck table 51 is rotatable in the direction shown by an arrow A in FIG. 4. The grinding means 52 includes a spindle housing 521, a rotating spindle 522 rotatably supported to the spindle housing 521 so as to be rotated by a rotational driving mechanism (not shown), a mounter 523 mounted on the lower end of the rotating spindle 522, and a grinding wheel 524 mounted on the lower surface of the mounter 523. The grinding wheel 524 is composed of a circular base 525 and a plurality of abrasive members 526 mounted on the lower surface of the base 525 so as to be annularly arranged along the outer circumference of the base 525. The base 525 is mounted to the lower surface of the mounter 523 by a plurality of fastening bolts 527.

Figure 4:
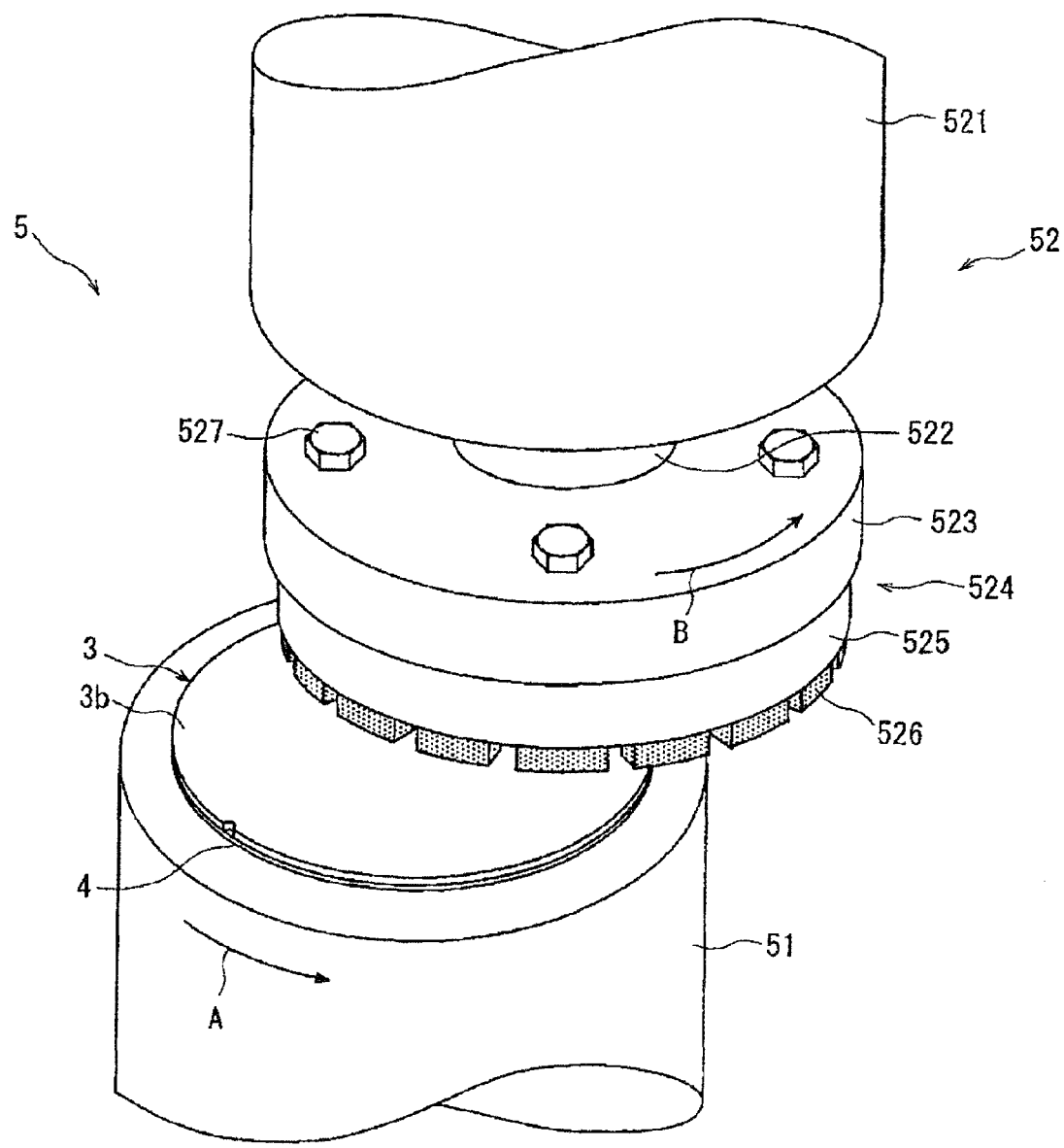
FIG. 4 is a perspective view for illustrating a stacking wafer grinding step in the first preferred embodiment of the stacked wafer manufacturing method according to the present invention.

The stacking wafer grinding step using this grinding apparatus 5 is performed in the following manner. First, the unit of the stacking wafer 3 and the protective tape 4 attached thereto is placed on the chuck table 51 in the condition where the protective tape 4 attached to the front side 3a of the stacking wafer 3 comes into contact with the upper surface (holding surface) of the chuck table 51 as shown in FIG. 4. In this condition, suction means (not shown) is operated to hold the stacking wafer 3 through the protective tape 4 on the chuck table 51 under suction. Accordingly, the back side 3b of the stacking wafer 3 held through the protective tape 4 on the chuck table 51 is oriented upward. In the condition where the stacking wafer 3 is held under suction on the chuck table 51 as mentioned above, the chuck table 51 is rotated at 300 rpm, for example, in the direction shown by the arrow A in FIG. 4 and the grinding wheel 524 of the grinding means 52 is also rotated at 6000 rpm, for example, in the direction shown by an arrow B in FIG. 4. Thereafter, the grinding wheel 524 is lowered to bring the abrasive members 526 into contact with the back side 3b of the stacking wafer 3. Thereafter, the grinding wheel 524 is fed downward at a feed speed of 1 μm/sec, for example, thereby grinding the back side 3b of the stacking wafer 3 to reduce the thickness of the stacking wafer 3 to 30 μm, for example.

Figure 5A:
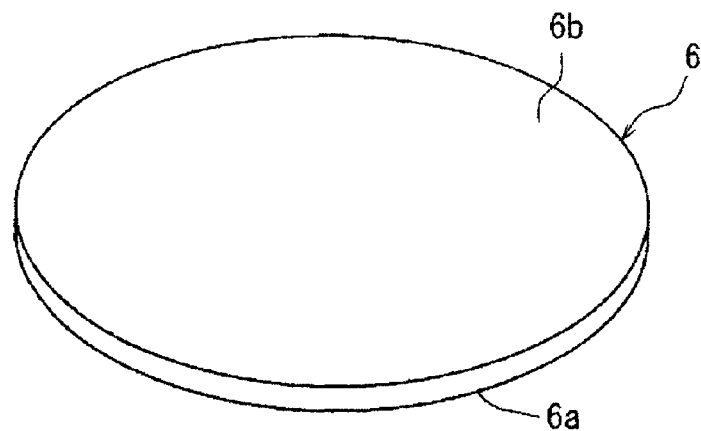
FIGS. 5A and 5B are perspective views for illustrating a reinforcing wafer bonding step in the first preferred embodiment of the stacked wafer manufacturing method according to the present invention.
Figure 5B:
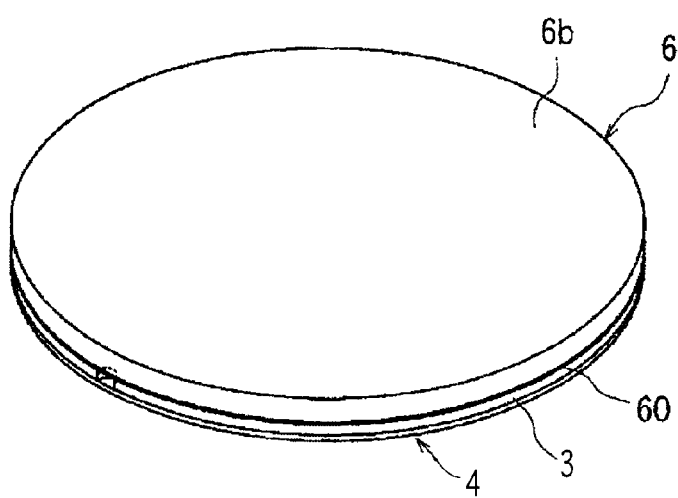

After performing the stacking wafer grinding step mentioned above, a reinforcing wafer bonding step is performed in such a manner that the front side of a reinforcing wafer is bonded through a bonding layer to the back side 3b of the stacking wafer 3. More specifically, as shown in FIGS. 5A and 5B, a reinforcing wafer 6 having a front side 6a and a back side 6b is prepared. The reinforcing wafer 6 is a disk-shaped silicon substrate having a thickness of 500 μm, for example. The front side 6a of the reinforcing wafer 6 is bonded through a bonding layer 60 to the back side 3b of the stacking wafer 3. The bonding layer 60 is formed of a material resistant to high temperature, such as epoxy resin. A silicon substrate is preferably used as the reinforcing wafer 6 because it is easy to work. The thickness of the bonding layer 60 is set to 20 μm, for example.

In the case that the electrodes 321 exposed to the back side of each second semiconductor device 32 are not formed in fabricating the stacking wafer 3, via holes for embedding the electrodes in each second semiconductor device may be formed by laser processing after performing the stacking wafer grinding step. Thereafter, an insulating film is formed on the inner surface of each via hole and the electrodes are next embedded into the via holes, respectively.

Figure 6A:
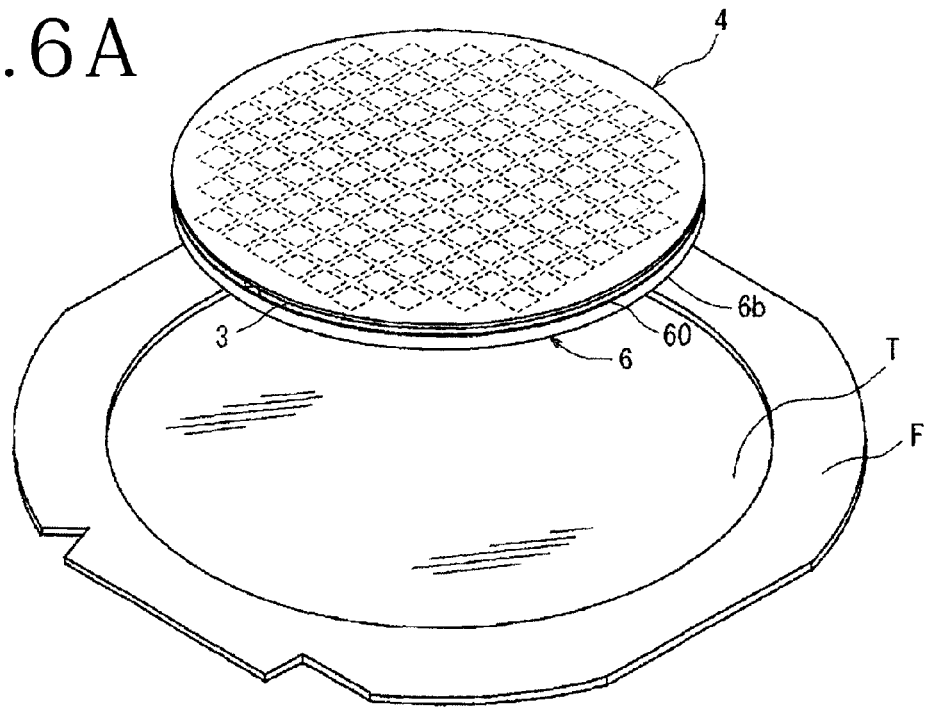
FIGS. 6A and 6B are perspective views for illustrating a wafer supporting step in the first preferred embodiment of the stacked wafer manufacturing method according to the present invention.
Figure 6B:
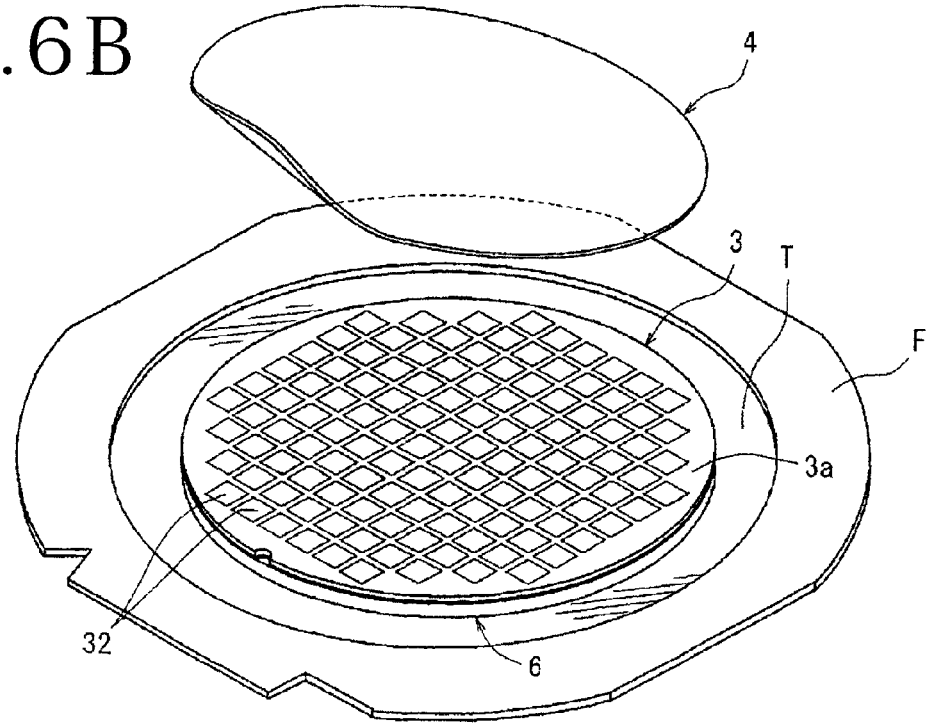

After performing the reinforcing wafer bonding step mentioned above, a wafer supporting step is performed in such a manner that the unit of the stacking wafer 3 and the reinforcing wafer 6 bonded together is supported through a dicing tape to an annular frame in the condition where the reinforcing wafer 6 is attached to the front side (adhesive surface) of the dicing tape supported to the annular frame. More specifically, as shown in FIGS. 6A and 6B, a dicing tape T is supported at its outer circumferential portion to an annular frame F so as to close the inner opening of the annular frame F. The back side 6b of the reinforcing wafer 6 bonded to the back side 3b of the stacking wafer 3 is attached to the front side (adhesive surface) of the dicing tape T. Thereafter, the protective tape 4 is peeled off from the front side 3a of the stacking wafer 3 as shown in FIG. 6B. The dicing tape T is composed of a base sheet and an adhesive layer formed on the front side of the base sheet. For example, the base sheet is formed of polyvinyl chloride (PVC) and has a thickness of 100 μm. The adhesive layer is formed of acrylic resin and has a thickness of about 5 μm.

After performing the wafer supporting step mentioned above, a stacking wafer dividing step is performed in such a manner that the stacking wafer 3 is divided together with the reinforcing wafer 6 into the individual second semiconductor devices 32, wherein the reinforcing wafer 6 is bonded to the back side of each second semiconductor device 32. This stacking wafer dividing step is performed by using a cutting apparatus 7 shown in FIG. 7. The cutting apparatus 7 shown in FIG. 7 includes a chuck table 71 for holding a workpiece, cutting means 72 for cutting the workpiece held on the chuck table 71, and imaging means 73 for imaging the workpiece held on the chuck table 71. The chuck table 71 is so configured as to hold the workpiece under suction. The chuck table 71 is movable in a feeding direction shown by an arrow X in FIG. 7 by feeding means (not shown) and also movable in an indexing direction shown by an arrow Y in FIG. 7 by indexing means (not shown).

The cutting means 72 includes a spindle housing 721 extending in a substantially horizontal direction, a rotating spindle 722 rotatably supported to the spindle housing 721, and a cutting blade 723 mounted on the front end portion of the rotating spindle 722. The rotating spindle 722 is rotated in the direction shown by an arrow C in FIG. 7 by a servo motor (not shown) provided in the spindle housing 721. For example, the cutting blade 723 is an electroformed blade obtained by bonding diamond abrasive grains having a grain size of 3 μm with a nickel plating. The cutting blade 723 has a thickness of 20 μm. The imaging means 73 is mounted on the front end portion of the spindle housing 721. The imaging means 73 includes illuminating means for illuminating the workpiece, an optical system for capturing an area illuminated by the illuminating means, and an imaging device (CCD) for imaging the area captured by the optical system. An image signal output from the imaging means 73 is transmitted to control means (not shown).

Figure 7:
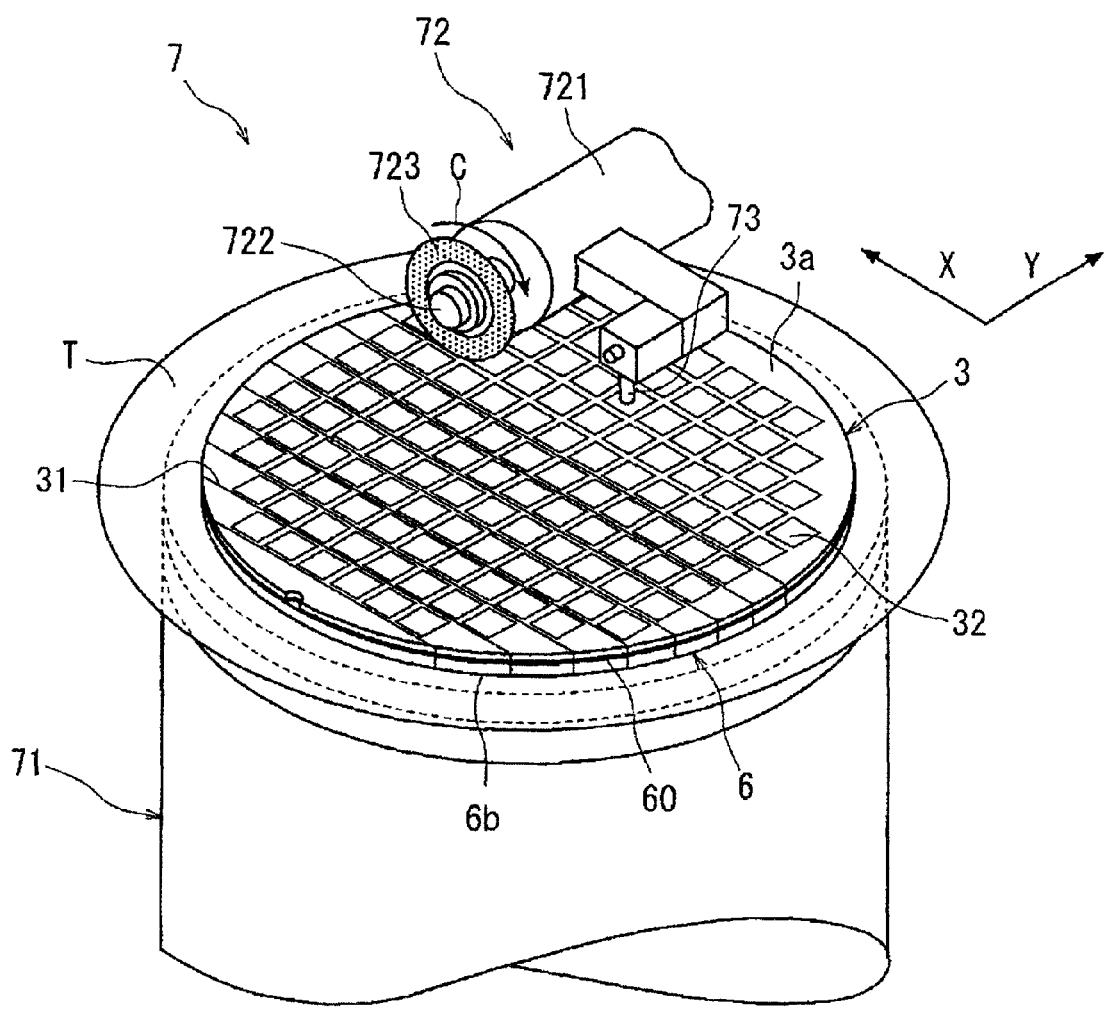
FIG. 7 is a perspective view of a cutting apparatus for performing a stacking wafer dividing step in the first preferred embodiment of the stacked wafer manufacturing method according to the present invention.

The stacking wafer dividing step using the cutting apparatus 7 is performed in the following manner. As shown in FIG. 7, the stacking wafer 3 bonded to the reinforcing wafer 6 is placed on the chuck table 71 in the condition where the dicing tape T attached to the back side 6b of the reinforcing wafer 6 comes into contact with the upper surface of the chuck table 71. By operating suction means (not shown), the unit of the stacking wafer 3 and the reinforcing wafer 6 is held under suction on the chuck table 71 through the dicing tape T (wafer holding step). Accordingly, the front side 3a of the stacking wafer 3 bonded to the front side 6a of the reinforcing wafer 6 held on the chuck table 71 is oriented upward. The chuck table 71 thus holding the unit of the stacking wafer 3 and the reinforcing wafer 6 under suction is moved to a position directly below the imaging means 73 by the feeding means.

When the chuck table 71 is positioned directly below the imaging means 73, an alignment operation is performed by the imaging means 73 and the control means to detect a cutting area of the stacking wafer 3. More specifically, the imaging means 73 and the control means perform the alignment between the cutting blade 723 and the streets 31 extending in a first direction on the front side 3a of the stacking wafer 3 (alignment step). Similarly, the imaging means 73 and the control means perform the alignment in a cutting area for the other streets 31 extending in a second direction perpendicular to the first direction on the front side 3a of the stacking wafer 3.

Figure 8A:
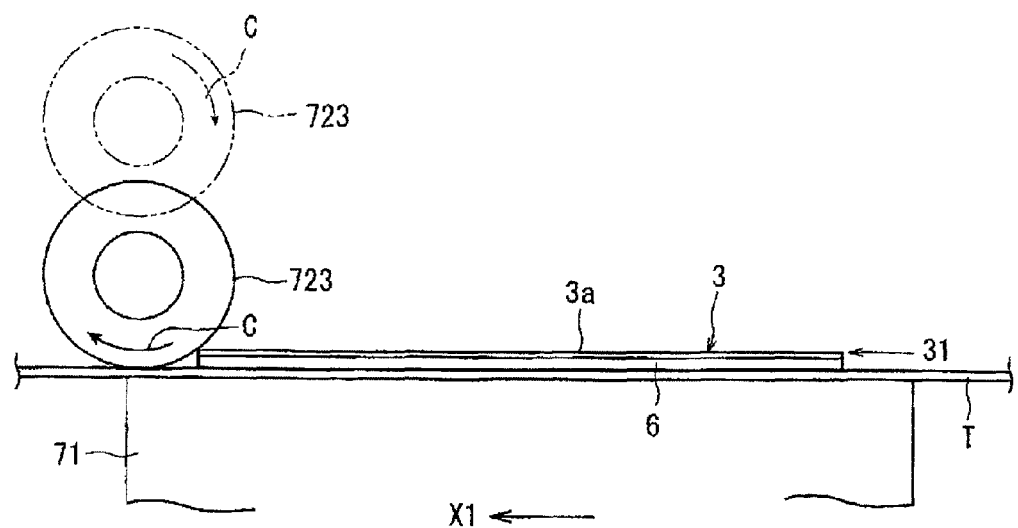
FIGS. 8A and 8B are sectional side views for illustrating the stacking wafer dividing step in the first preferred embodiment.

After performing the alignment operation for detecting the cutting area of the stacking wafer 3 held on the chuck table 71, the chuck table 71 holding the stacking wafer 3 is moved to a cutting start position in the cutting area below the cutting blade 723. At this cutting start position, one end (left end as viewed in FIG. 8A) of one of the streets 31 extending in the first direction is positioned on the right side of the cutting blade 723 by a predetermined amount as shown in FIG. 8A (cutting start position setting step). When the stacking wafer 3 is set at this cutting start position as mentioned above, the cutting blade 723 is rotated in the direction shown by an arrow C in FIG. 8A and simultaneously moved down from a standby position shown by a phantom line in FIG. 8A to a working position shown by a solid line in FIG. 8A, thus performing an infeed operation by a predetermined amount. This working position of the cutting blade 723 is set so that the outer circumference of the cutting blade 723 reaches the dicing tape T.

Figure 8B:
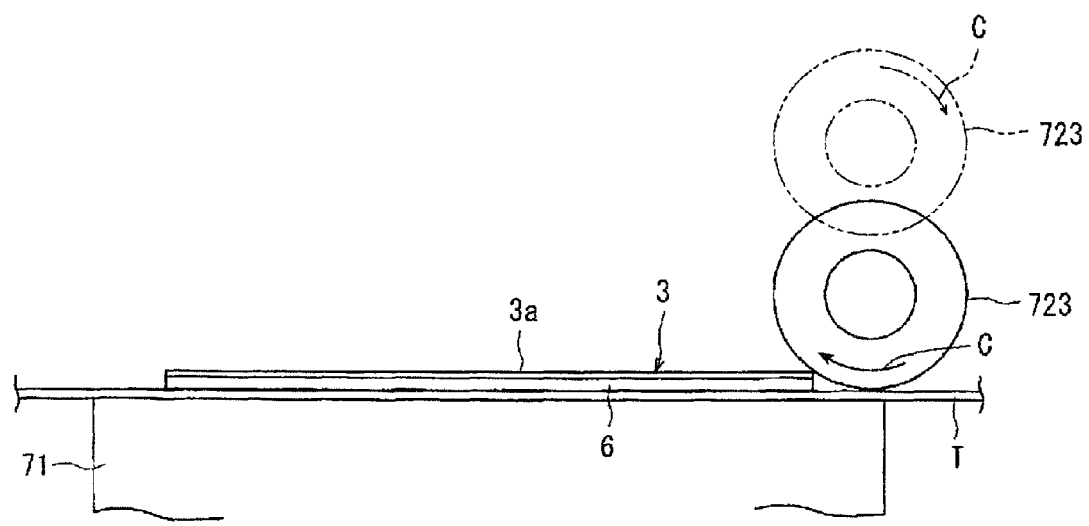

After performing the infeed operation of the cutting blade 723, the chuck table 71 is moved at a feed speed of 50 to 150 mm/sec, for example, in the direction shown by an arrow X1 in FIG. 8A as rotating the cutting blade 723 at a rotational speed of 20000 rpm, for example, in the direction shown by the arrow C. As a result, the stacking wafer 3 and the reinforcing wafer 6 are cut along the target street 31 extending in the first direction (stacking wafer dividing step). When the other end (right end as viewed in FIG. 8B) of the target street 31 extending in the first direction reaches a position on the left side of the cutting blade 723 by a predetermined amount as shown in FIG. 8B, the movement of the chuck table 71 is stopped. Thereafter, the cutting blade 723 is raised to a retracted position shown by a phantom line in FIG. 8B.

Figure 9:
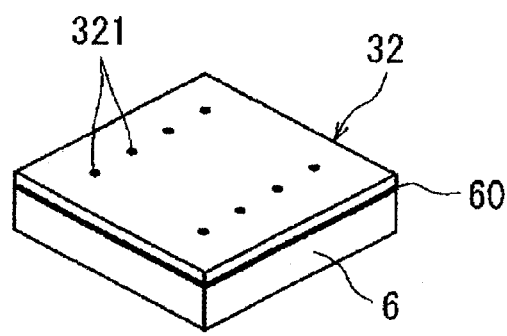
FIG. 9 is a perspective view of each second semiconductor device obtained by performing the stacking wafer dividing step shown in FIGS. 8A and 8B.

After performing the stacking wafer dividing step along all of the streets 31 extending in the first direction on the stacking wafer 3, the chuck table 71 is rotated 90° to similarly perform the stacking wafer dividing step along all of the streets 31 extending in the second direction perpendicular to the first direction. As a result, the unit of the stacking wafer 3 and the reinforcing wafer 6 is divided along all of the crossing streets 31 extending in the first and second directions to obtain the individual second semiconductor devices 32. FIG. 9 shows one of these second semiconductor devices 32, wherein the reinforcing wafer 6 is bonded to the back side (lower surface) of the second semiconductor device 32.

Figure 10A:
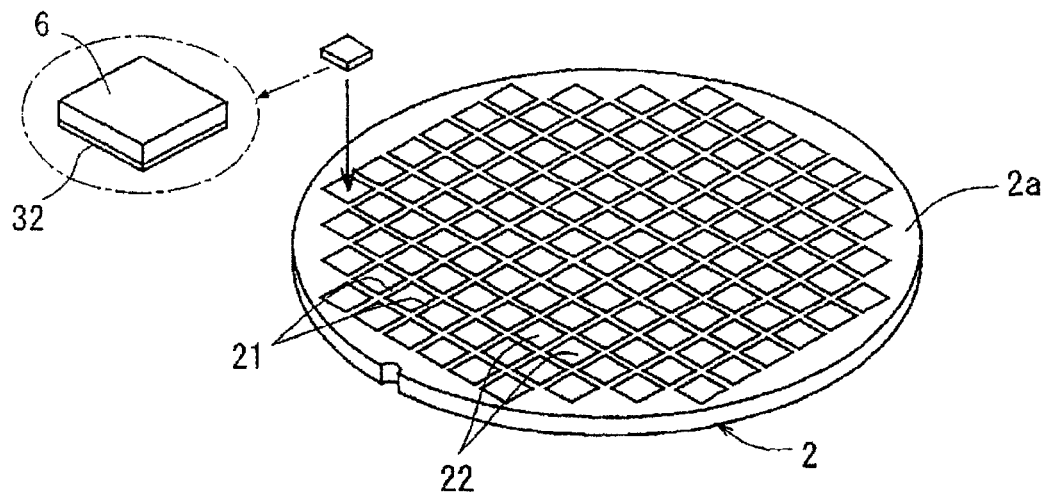
FIG. 10A is a perspective view for illustrating a second semiconductor device bonding step in the first preferred embodiment of the stacked wafer manufacturing method according to the present invention.
Figure 10B:
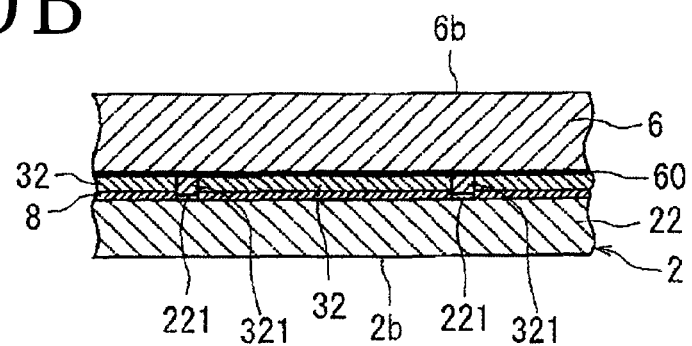
FIG. 10B is a sectional view of an essential part of the unit of the mother wafer, each second semiconductor device, and the reinforcing wafer shown in FIG. 10A.
Figure 10C:
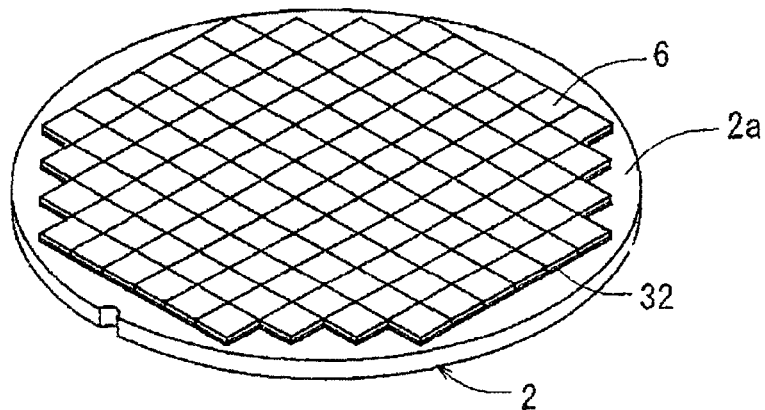
FIG. 10C is a perspective view of the unit of the mother wafer, all the second semiconductor devices, and the reinforcing wafer obtained by the second semiconductor device bonding step in the first preferred embodiment.

After performing the stacking wafer dividing step mentioned above, a second semiconductor device bonding step is performed in such a manner that the plural electrodes provided on the front side of each second semiconductor device 32 are bonded to the plural electrodes provided on the mother wafer 2. More specifically, as shown in FIG. 10A, one of the individual second semiconductor devices 32 is stacked on a predetermined one of the plural first semiconductor devices 22 formed on the front side 2a of the mother wafer 2 in the condition where the front side of this second semiconductor device 32 is opposed to the front side of this first semiconductor device 22, and flip-chip bonding is performed to respectively bond the electrodes 321 projecting from the front side of this second semiconductor device 32 to the electrodes 221 projecting from the front side of this first semiconductor device 22 formed on the front side 2a of the mother wafer 2 as shown in FIG. 10B. This second semiconductor device bonding step is similarly performed for all of the first semiconductor devices 22 formed on the front side 2a of the mother wafer 2 as shown in FIG. 10C.

Since this second semiconductor device bonding step is performed in the condition where the reinforcing wafer 6 is bonded to the back side of each second semiconductor device 32, each second semiconductor device 32 having a very small thickness can be easily handled, so that the electrodes 321 projecting from the front side of each second semiconductor device 32 can be reliably bonded to the electrodes 221 projecting from the front side of each first semiconductor device 22 formed on the front side 2a of the mother wafer 2, thereby preventing faulty electrical connection between the electrodes 321 and the electrodes 221. In this second semiconductor device bonding step, a resin 8 as an underfill material is preferably interposed between the front side 2a of the mother wafer 2 and the front side of each second semiconductor device 32 as shown in FIG. 10B.

Figure 11:
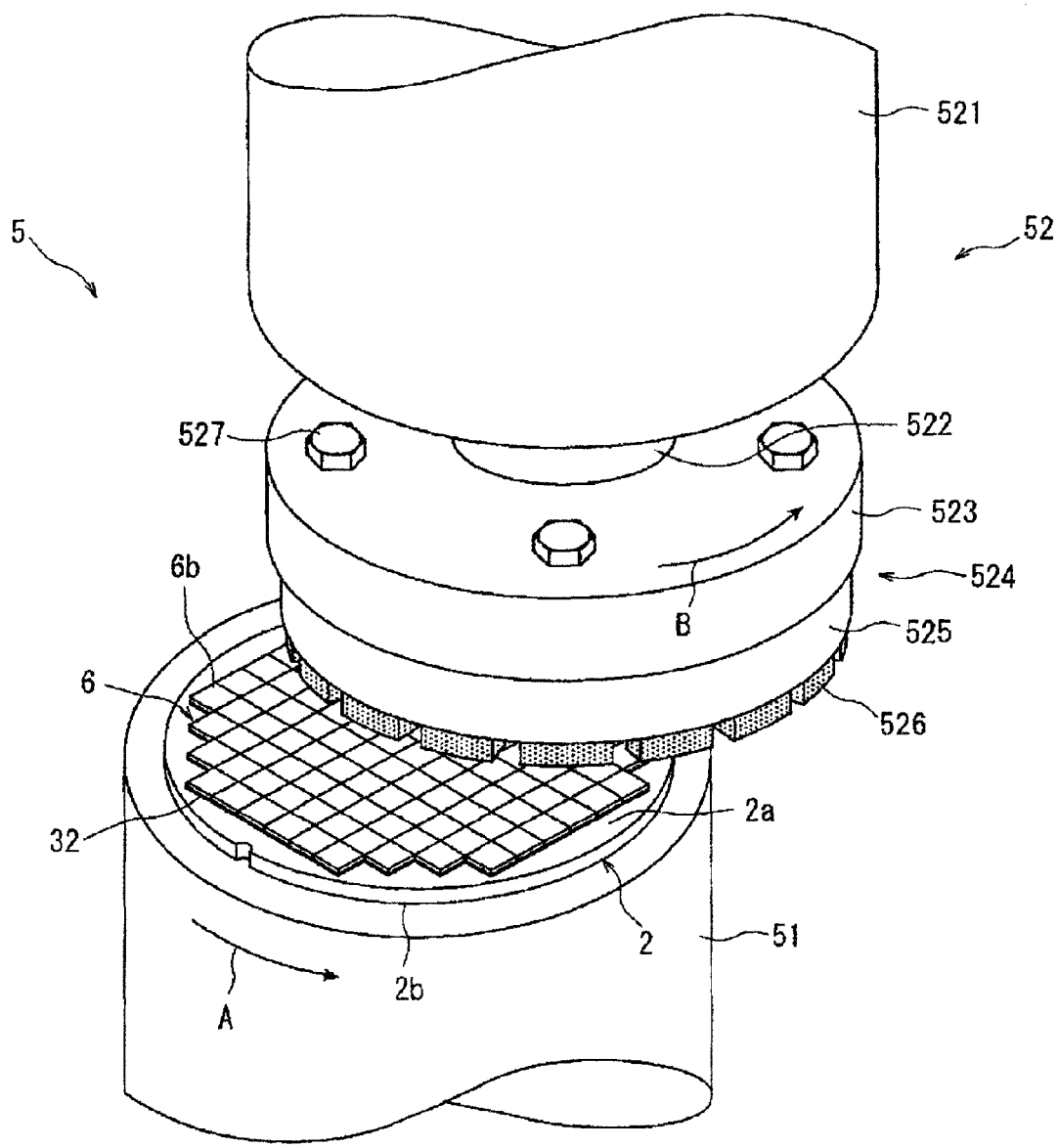
FIG. 11 is a perspective view for illustrating a reinforcing wafer removing step in the first preferred embodiment of the stacked wafer manufacturing method according to the present invention.

After performing the second semiconductor device bonding step mentioned above, a reinforcing wafer removing step is performed in such a manner that the unit of the mother wafer 2, the second semiconductor devices 32, and the reinforcing wafer 6 bonded together is held on a chuck table of a grinding apparatus and the reinforcing wafer 6 bonded to the back side of each second semiconductor device 32 is ground to be removed. This reinforcing wafer removing step may be performed by using the grinding apparatus 5 shown in FIG. 4. This reinforcing wafer removing step using the grinding apparatus 5 is performed in the following manner. First, the unit of the mother wafer 2, the second semiconductor devices 32, and the reinforcing wafer 6 bonded together is placed on the chuck table 51 in the condition where the back side 2b of the mother wafer 2 comes into contact with the upper surface (holding surface) of the chuck table 51 as shown in FIG. 11. In this condition, the suction means is operated to hold the unit of the mother wafer 2, the second semiconductor devices 32, and the reinforcing wafer 6 on the chuck table 51 under suction. Accordingly, the back side 6b of the reinforcing wafer 6 constituting this unit held on the chuck table 51 is oriented upward.

Figure 12:
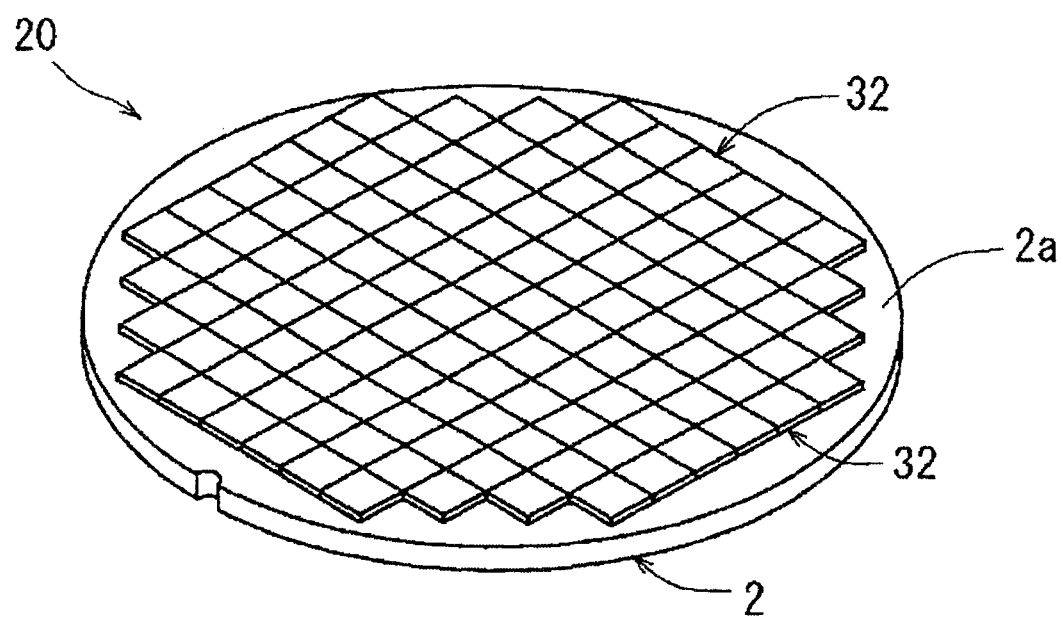
FIG. 12 is a perspective view of a stacked wafer manufactured by the stacked wafer manufacturing method according to the present invention.

In the condition where the unit of the mother wafer 2, the second semiconductor devices 32, and the reinforcing wafer 6 is held under suction on the chuck table 51 as mentioned above, the chuck table 51 is rotated at 300 rpm, for example, in the direction shown by an arrow A in FIG. 11 and the grinding wheel 524 of the grinding means 52 is also rotated at 6000 rpm, for example, in the direction shown by an arrow B in FIG. 11. Thereafter, the grinding wheel 524 is lowered to bring the abrasive members 526 into contact with the back side 6b of the reinforcing wafer 6. Thereafter, the grinding wheel 524 is fed downward at a feed speed of 1 μm/sec, for example, by an amount of 520 μm, for example. As a result, the reinforcing wafer 6 having a thickness of 500 μm and the bonding layer 60 having a thickness of 20 μm are ground to be removed from the back side (upper surface) of each semiconductor device 32 as shown in FIG. 12. FIG. 12 shows a stacked wafer 20 composed of the mother wafer 2 and the second semiconductor devices 32 stacked on the mother wafer 2 so that the front side of each second semiconductor device 32 is bonded to the front side of each first semiconductor device 22 formed on the front side 2a of the mother wafer 2.

In the reinforcing wafer removing step mentioned above, the reinforcing wafer 6 bonded to the back side of each second semiconductor device 32 is removed by grinding, so that no load is applied to each second semiconductor device 32. Accordingly, it is not necessary to perform an operation as in the prior art such that the reinforcing wafer 6 is heated to a temperature higher than 250° C. for the purpose of removing the reinforcing wafer 6 from the back side of each second semiconductor device 32, that the reinforcing wafer 6 is slid along the back side of each second semiconductor device 32 and removed therefrom without applying a load to each second semiconductor device 32, and that the reinforcing wafer 6 is cooled to ordinary temperature. Therefore, the productivity can be improved.

There will now be described a second preferred embodiment of the stacked wafer manufacturing method according to the present invention. Also in the second preferred embodiment, the protective member attaching step, the stacking wafer grinding step, the reinforcing wafer bonding step, and the wafer supporting step are similarly performed as in the first preferred embodiment.

Figure 13:
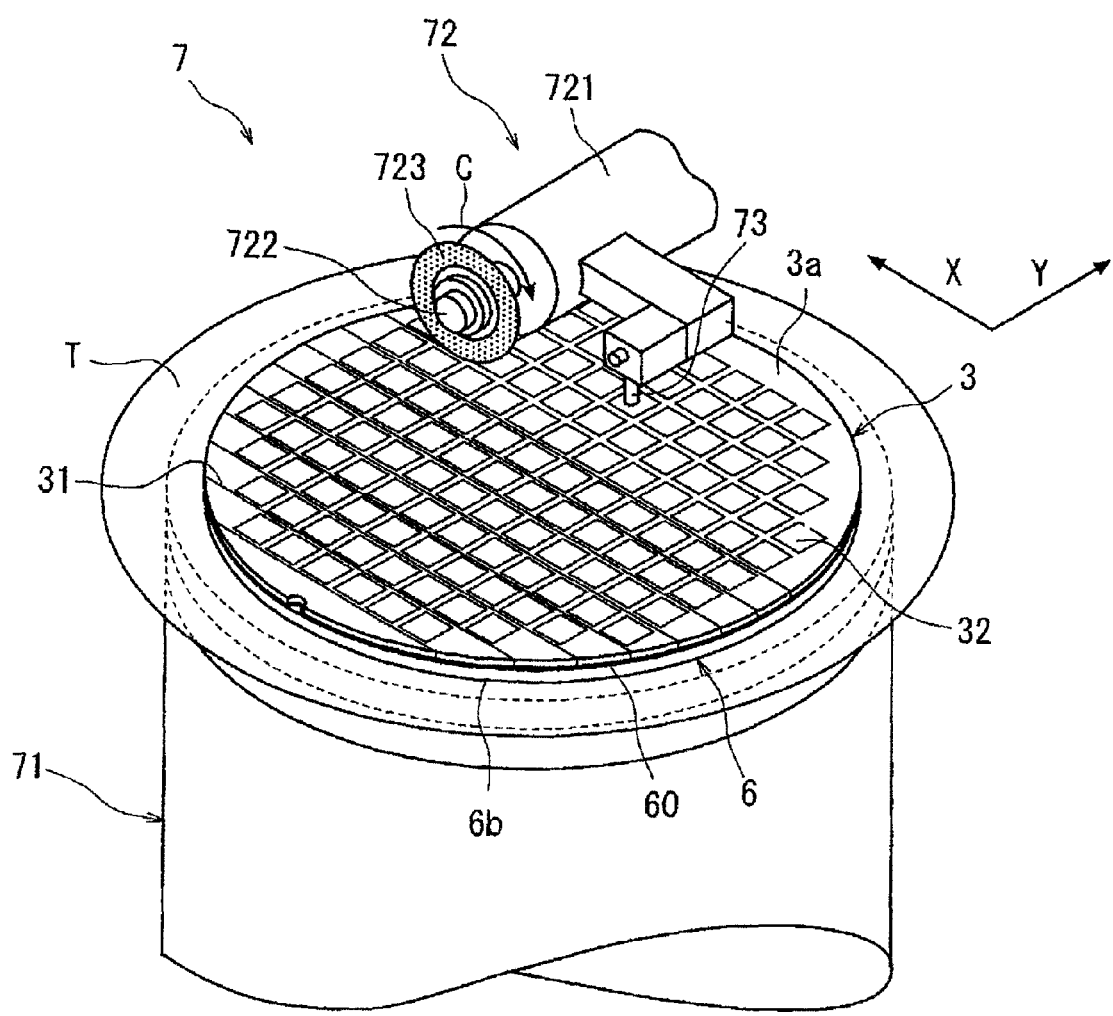
FIG. 13 is a perspective view of a cutting apparatus for performing a stacking wafer dividing step in a second preferred embodiment of the stacked wafer manufacturing method according to the present invention.

After performing the protective member attaching step, the stacking wafer grinding step, the reinforcing wafer bonding step, and the wafer supporting step in this order, a stacking wafer dividing is performed in such a manner that the stacking wafer 3 bonded to the reinforcing wafer 6 is divided into the individual second semiconductor devices 32. Alternatively, a second semiconductor device bonding step to be hereinafter described may be performed without performing the above-mentioned stacking wafer dividing step. This stacking wafer dividing step may be performed by using the cutting apparatus 7 shown in FIG. 7. The stacking wafer dividing step using the cutting apparatus 7 is performed in the following manner. As shown in FIG. 13, the stacking wafer 3 bonded to the reinforcing wafer 6 is placed on the chuck table 71 in the condition where the dicing tape T attached to the back side 6b of the reinforcing wafer 6 comes into contact with the upper surface of the chuck table 71. By operating the suction means, the unit of the stacking wafer 3 and the reinforcing wafer 6 is held under suction on the chuck table 71 through the dicing tape T (wafer holding step). Accordingly, the front side 3a of the stacking wafer 3 bonded to the front side 6a of the reinforcing wafer 6 held on the chuck table 71 is oriented upward. The chuck table 71 thus holding the unit of the stacking wafer 3 and the reinforcing wafer 6 under suction is moved to a position directly below the imaging means 73 by the feeding means.

When the chuck table 71 is positioned directly below the imaging means 73, an alignment operation is performed by the imaging means 73 and the control means to detect a cutting area of the stacking wafer 3. This alignment operation is performed similarly as in the first preferred embodiment.

Figure 14A:
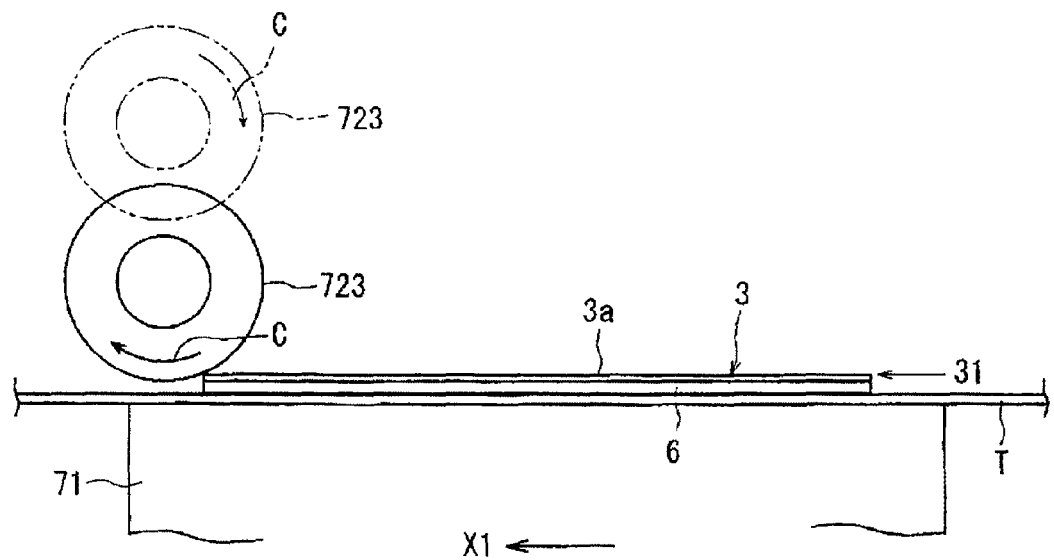
FIGS. 14A and 14B are sectional side views for illustrating the stacking wafer dividing step in the second preferred embodiment.

After performing the alignment operation for detecting the cutting area of the stacking wafer 3 held on the chuck table 71, the chuck table 71 holding the stacking wafer 3 is moved to a cutting start position in the cutting area below the cutting blade 723. At this cutting start position, one end (left end as viewed in FIG. 14A) of one of the streets 31 extending in the first direction is positioned on the right side of the cutting blade 723 by a predetermined amount as shown in FIG. 14A (cutting start position setting step). When the stacking wafer 3 is set at this cutting start position as mentioned above, the cutting blade 723 is rotated in the direction shown by an arrow C in FIG. 14A and simultaneously moved down from a standby position shown by a phantom line in FIG. 14A to a working position shown by a solid line in FIG. 14A, thus performing an infeed operation by a predetermined amount. This working position of the cutting blade 723 is set so that the outer circumference of the cutting blade 723 reaches the back side (lower surface) 3b of the stacking wafer 3.

Figure 14B:
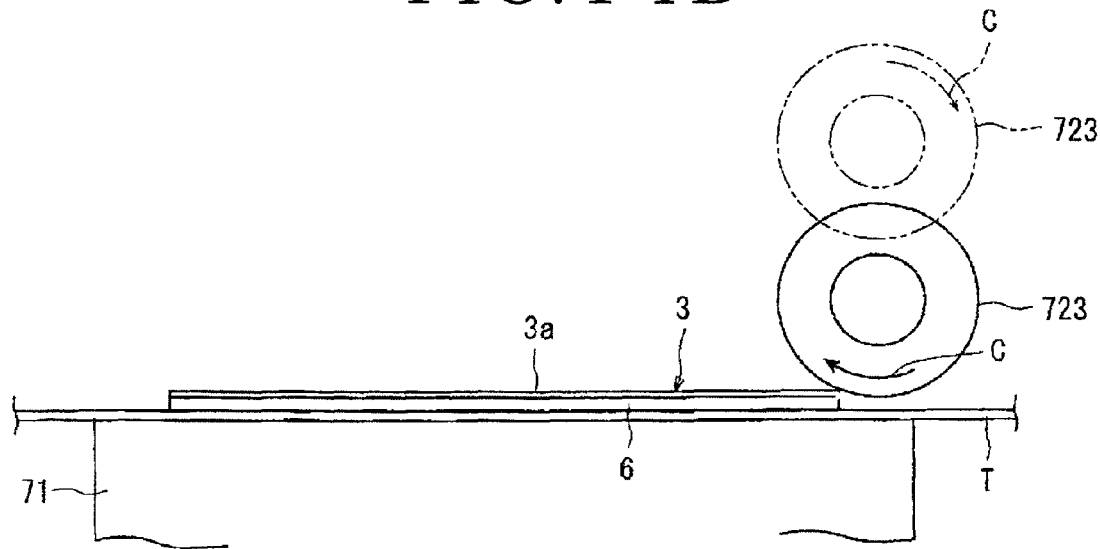

After performing the infeed operation of the cutting blade 723, the chuck table 71 is moved at a feed speed of 50 to 150 mm/sec, for example, in the direction shown by an arrow X1 in FIG. 14A as rotating the cutting blade 723 at a rotational speed of 20000 rpm, for example, in the direction shown by the arrow C. As a result, only the stacking wafer 3 is cut along the target street 31 extending in the first direction (stacking wafer dividing step). When the other end (right end as viewed in FIG. 14B) of the target street 31 extending in the first direction reaches a position on the left side of the cutting blade 723 by a predetermined amount as shown in FIG. 14B, the movement of the chuck table 71 is stopped. Thereafter, the cutting blade 723 is raised to a retracted position shown by a phantom line in FIG. 14B.

Figure 15:
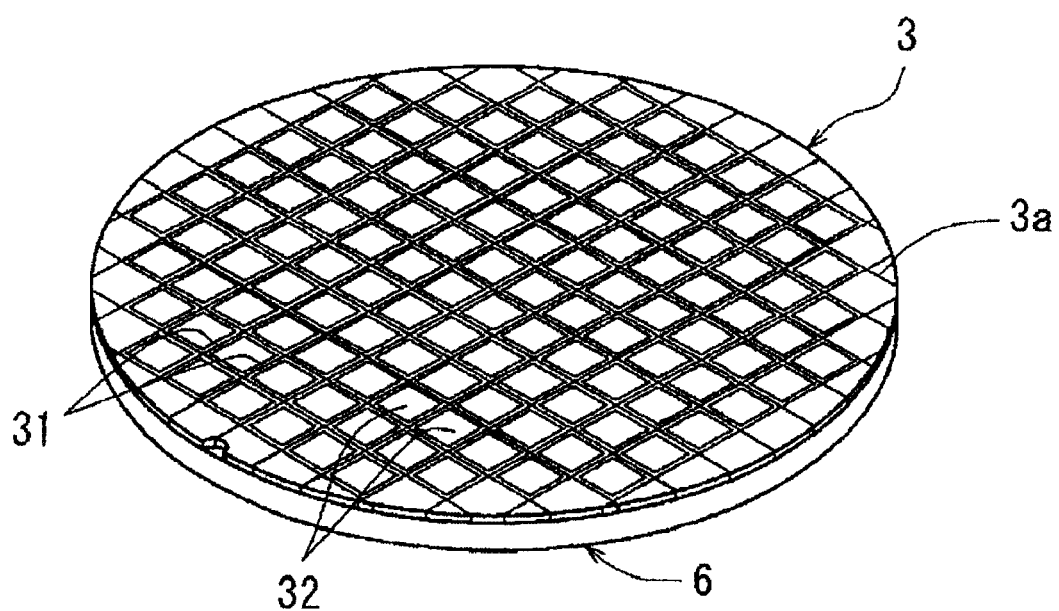
FIG. 15 is a perspective view of the stacking wafer obtained by performing the stacking wafer dividing step shown in FIGS. 14A and 14B.

After performing the stacking wafer dividing step along all of the streets 31 extending in the first direction on the stacking wafer 3, the chuck table 71 is rotated 90° to similarly perform the stacking wafer dividing step along all of the streets 31 extending in the second direction perpendicular to the first direction. As a result, only the stacking wafer 3 is divided along all of the crossing streets 31 extending in the first and second directions to obtain the individual second semiconductor devices 32. FIG. 15 shows these second semiconductor devices 32 divided from each other, wherein the reinforcing wafer 6 is bonded to the back side 3b (lower surface) of the stacking wafer 3.

Figure 16A:
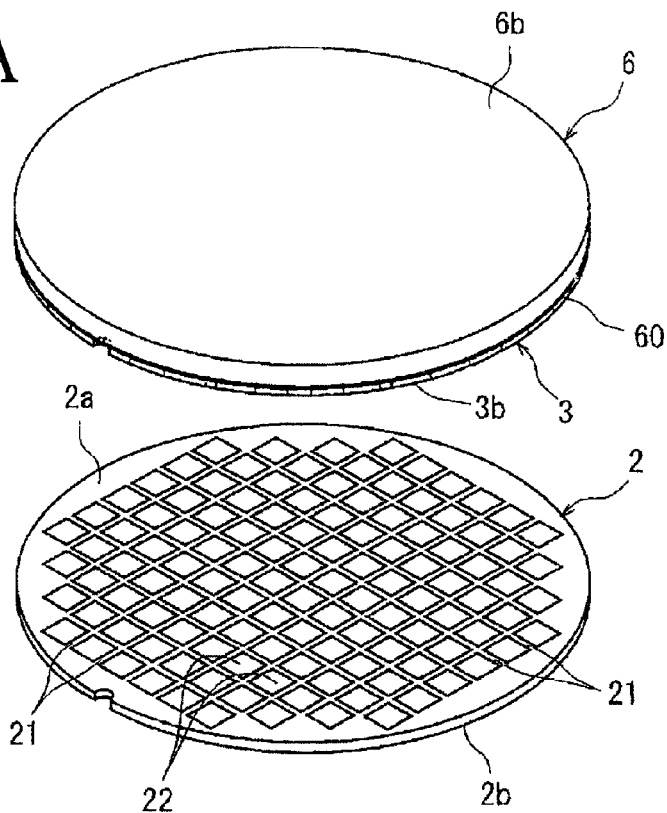
FIGS. 16A and 16B are perspective views for illustrating a second semiconductor device bonding step in the second preferred embodiment of the stacked wafer manufacturing method according to the present invention.
Figure 16B:
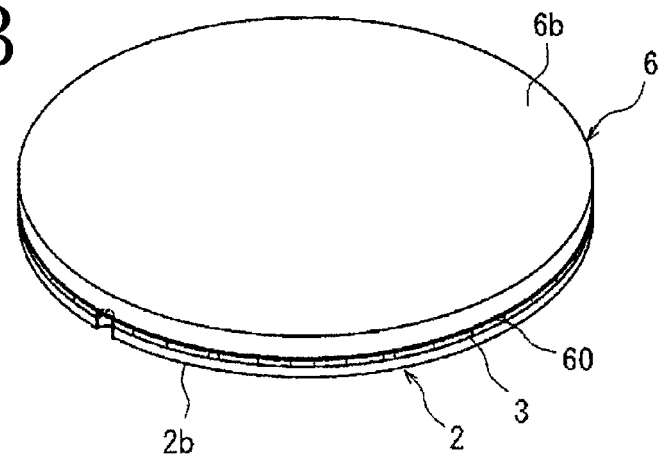
Figure 16C:
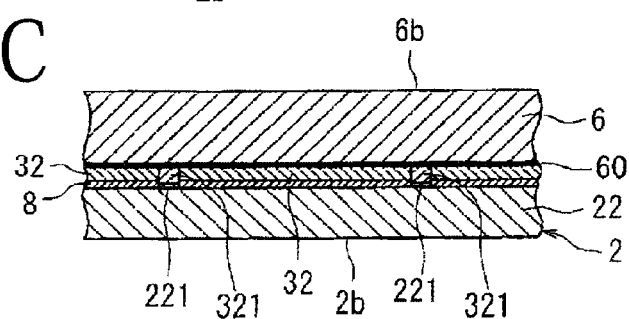
FIG. 16C is a sectional view of an essential part of the unit of the mother wafer, the stacking wafer, and the reinforcing wafer shown in FIG. 16B.

After performing the stacking wafer dividing step mentioned above, a second semiconductor device bonding step is performed in such a manner that the unit of the stacking wafer 3 and the reinforcing wafer 6 bonded together is stacked on the mother wafer 2 in the condition where the front side 3a of the stacking wafer 3 is opposed to the front side 2a of the mother wafer 2, thereby bonding the electrodes provided on the front side of each second semiconductor device 32 to the electrodes provided on the front side 2a of the mother wafer 2. More specifically, as shown in FIGS. 16A and 16B, the unit of the stacking wafer 3 and the reinforcing wafer 6 bonded together is stacked on the front side 2a of the mother wafer 2 in the condition where the front side 3a of the stacking wafer 3 is opposed to the front side 2a of the mother wafer 2, and flip-chip bonding is performed to respectively bond the electrodes 321 projecting from the front side of each second semiconductor device 32 to the electrodes 221 projecting from the front side of each first semiconductor device 22 formed on the front side 2a of the mother wafer 2 as shown in FIG. 16C. Since this second semiconductor device bonding step is performed in the condition where the reinforcing wafer 6 is bonded to the back side 3b of the stacking wafer 3, each second semiconductor device 32 having a very small thickness can be easily handled, so that the electrodes 321 projecting from the front side of each second semiconductor device 32 can be reliably bonded to the electrodes 221 projecting from the front side of each first semiconductor device 22 formed on the front side 2a of the mother wafer 2, thereby preventing faulty electrical connection between the electrodes 321 and the electrodes 221. In this second semiconductor device bonding step, a resin 8 as an underfill material is preferably interposed between the front side 2a of the mother wafer 2 and the front side of each second semiconductor device 32 as shown in FIG. 16C.

Figure 17:
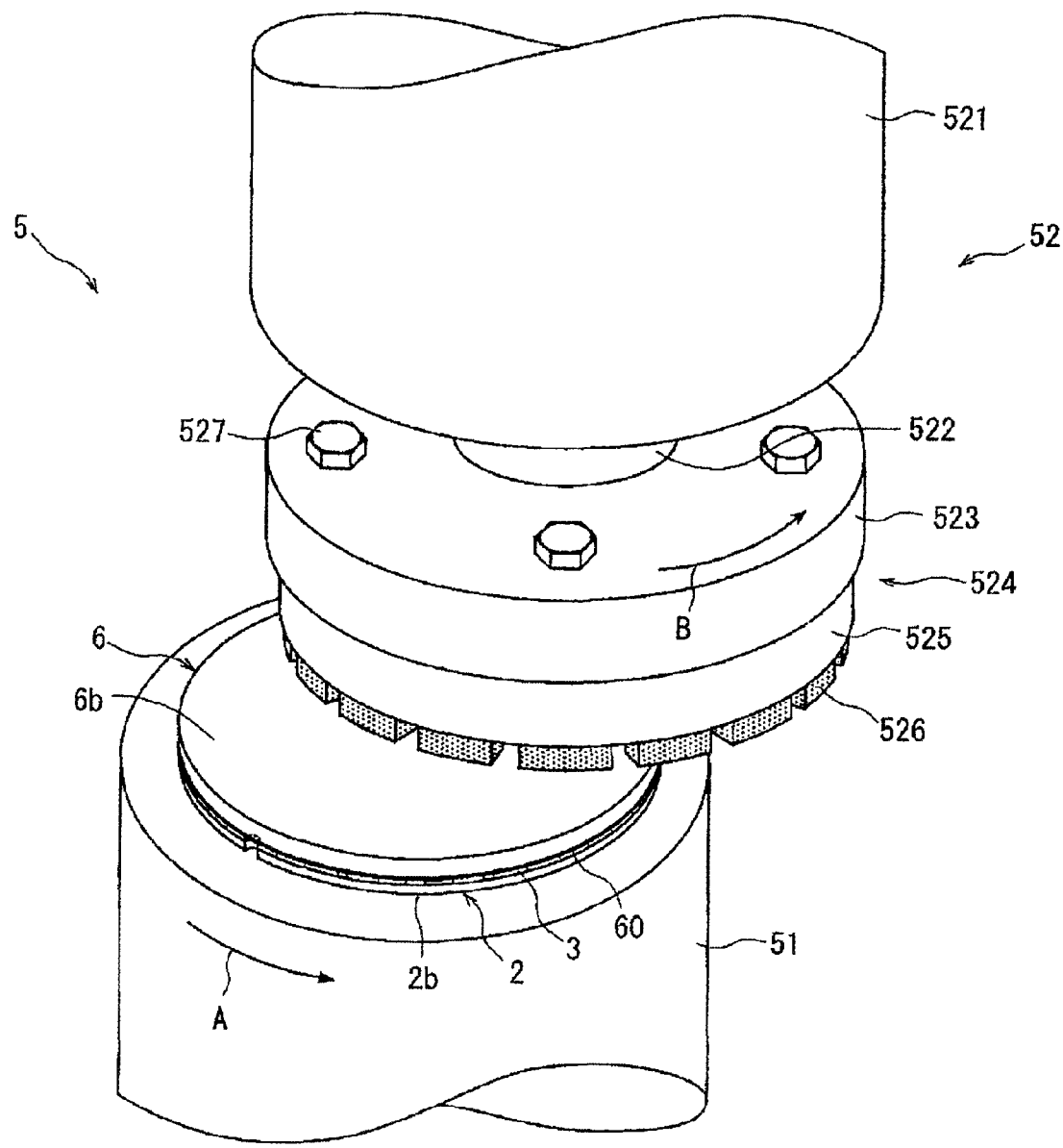
FIG. 17 is a perspective view for illustrating a reinforcing wafer removing step in the second preferred embodiment of the stacked wafer manufacturing method according to the present invention.

After performing the second semiconductor device bonding step mentioned above, a reinforcing wafer removing step is performed in such a manner that the unit of the mother wafer 2, the second semiconductor devices (the stacking wafer 3), and the reinforcing wafer 6 bonded together is held on a chuck table of a grinding apparatus and the reinforcing wafer 6 bonded to the back side of each second semiconductor device 32 is ground to be removed. This reinforcing wafer removing step may be performed by using the grinding apparatus 5 shown in FIG. 4 in a manner similar to that of the reinforcing wafer removing step shown in FIG. 11 in the first preferred embodiment. This reinforcing wafer removing step using the grinding apparatus 5 is performed in the following manner. First, the unit of the mother wafer 2, the second semiconductor devices 32 (the stacking wafer 3), and the reinforcing wafer 6 bonded together is placed on the chuck table 51 in the condition where the back side 2b of the mother wafer 2 comes into contact with the upper surface (holding surface) of the chuck table 51 as shown in FIG. 17. In this condition, the suction means is operated to hold the unit of the mother wafer 2, the second semiconductor devices 32 (the stacking wafer 3), and the reinforcing wafer 6 on the chuck table 51 under suction. Accordingly, the back side 6b of the reinforcing wafer 6 constituting this unit held on the chuck table 51 is oriented upward. In the condition where the unit of the mother wafer 2, the second semiconductor devices 32 (the stacking wafer 3), and the reinforcing wafer 6 is held under suction on the chuck table 51 as mentioned above, the chuck table 51 is rotated at 300 rpm, for example, in the direction shown by an arrow A in FIG. 17 and the grinding wheel 524 of the grinding means 52 is also rotated at 6000 rpm, for example, in the direction shown by an arrow B in FIG. 17. Thereafter, the grinding wheel 524 is lowered to bring the abrasive members 526 into contact with the back side 6*b* of the reinforcing wafer 6. Thereafter, the grinding wheel 524 is fed downward at a feed speed of 1 μm/sec, for example, by an amount of 520 μm, for example. As a result, the reinforcing wafer 6 having a thickness of 500 μm and the bonding layer 60 having a thickness of 20 μm are ground to be removed from the back side (upper surface) of each second semiconductor device 32 as shown in FIG. 12.

In the reinforcing wafer removing step mentioned above, the reinforcing wafer 6 bonded to the back side of each second semiconductor device 32 is removed by grinding, so that no load is applied to each second semiconductor device 32. Accordingly, it is not necessary to perform an operation as in the prior art such that the reinforcing wafer 6 is heated to a temperature higher than 250° C. for the purpose of removing the reinforcing wafer 6 from the back side of each second semiconductor device 32, that the reinforcing wafer 6 is slid along the back side of each second semiconductor device 32 and removed therefrom without applying a load to each second semiconductor device 32, and that the reinforcing wafer 6 is cooled to ordinary temperature. Therefore, the productivity can be improved.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A manufacturing method for a stacked wafer configured by bonding a mother wafer having a plurality of first semiconductor devices on the front side thereof and a stacking wafer having a plurality of second semiconductor devices on the front side thereof, each of said first semiconductor devices having a plurality of first electrodes, each of said second semiconductor devices having a plurality of second electrodes, said manufacturing method comprising:

a protective member attaching step of attaching a protective member to the front side of said stacking wafer;

a stacking wafer grinding step of holding a unit of said stacking wafer and said protective member attached thereto on a chuck table of a grinding apparatus after performing said protective member attaching step and grinding the back side of said stacking wafer to reduce the thickness of said stacking wafer to a predetermined thickness;

a reinforcing wafer bonding step of bonding the front side of a reinforcing wafer through a bonding layer to the back side of said stacking wafer after performing said stacking wafer grinding step;

a stacking wafer dividing step of dividing said stacking wafer together with said reinforcing wafer into said plurality of second semiconductor devices after performing said reinforcing wafer bonding step;

a second semiconductor device bonding step of respectively bonding said plurality of second electrodes provided on the front side of each second semiconductor device to said plurality of first electrodes provided on said mother wafer after performing said stacking wafer dividing step; and a reinforcing wafer removing step of holding a unit of said mother wafer, said second semiconductor devices, and said reinforcing wafer bonded together on a chuck table of a grinding apparatus after performing said second semiconductor device bonding step and grinding said reinforcing wafer bonded to the back side of each second semiconductor device to thereby remove said reinforcing wafer from the back side of each second semiconductor device.

2. A manufacturing method for a stacked wafer configured by bonding a mother wafer having a plurality of first semiconductor devices on the front side thereof and a stacking wafer having a plurality of second semiconductor devices on the front side thereof, each of said first semiconductor devices having a plurality of first electrodes, each of said second semiconductor devices having a plurality of second electrodes, said manufacturing method comprising:

a protective member attaching step of attaching a protective member to the front side of said stacking wafer;

a stacking wafer grinding step of holding a unit of said stacking wafer and said protective member attached thereto on a chuck table of a grinding apparatus after performing said protective member attaching step and grinding the back side of said stacking wafer to reduce the thickness of said stacking wafer to a predetermined thickness;

a reinforcing wafer bonding step of bonding the front side of a reinforcing wafer through a bonding layer to the back side of said stacking wafer after performing said stacking wafer grinding step;

a second semiconductor device bonding step of stacking a unit of said stacking wafer and said reinforcing wafer bonded together on said mother wafer in the condition where the front side of said stacking wafer is opposed to the front side of said mother wafer after performing said reinforcing wafer bonding step, thereby respectively bonding said second electrodes provided on the front side of each second semiconductor device of said stacking wafer to said first electrodes provided on the front side of each first semiconductor device of said mother wafer; and a reinforcing wafer removing step of holding a unit of said mother wafer, said stacking wafer, and said reinforcing wafer bonded together on a chuck table of a grinding apparatus after performing said second semiconductor device bonding step and grinding said reinforcing wafer bonded to the back side of said stacking wafer to thereby remove said reinforcing wafer from the back side of said stacking wafer.

3. The manufacturing method for the stacked wafer according to claim 2, further comprising a stacking wafer dividing step of dividing said stacking wafer into said plurality of second semiconductor devices after performing said reinforcing wafer bonding step and before performing said second semiconductor device bonding step.

\* \* \* \* \*